(12) United States Patent
Zhu et al.

(10) Patent No.: US 8,440,532 B2
(45) Date of Patent: May 14, 2013

(54) STRUCTURE AND METHOD FOR MAKING METAL SEMICONDUCTOR FIELD EFFECT TRANSISTOR (MOSFET) WITH ISOLATION LAST PROCESS

(75) Inventors: Huilong Zhu, Poughkeepsie, NY (US); Qingqing Liang, Fishkill, NY (US); Zhijiong Luo, Carmel, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 263 days.

(21) Appl. No.: 12/844,478

(22) Filed: Jul. 27, 2010

(65) Prior Publication Data
US 2012/0025319 A1    Feb. 2, 2012

(51) Int. Cl.
*H01L 21/336* (2006.01)
(52) U.S. Cl.
USPC ............ 438/294; 438/199; 438/295; 438/296
(58) Field of Classification Search .................. 438/199, 438/294, 295, 296; 257/69, 195, 204, 206
See application file for complete search history.

(56) References Cited

U.S. PATENT DOCUMENTS

| | | | |
|---|---|---|---|
| 5,569,620 A | 10/1996 | Linn et al. | |
| 5,801,084 A | 9/1998 | Beasom et al. | |
| 6,998,324 B2 | 2/2006 | Seo | |
| 7,242,069 B2 | 7/2007 | Bui et al. | |
| 7,531,407 B2 | 5/2009 | Dalton | |
| 7,588,993 B2 | 9/2009 | Liu et al. | |
| 7,598,147 B2 * | 10/2009 | Liu et al. | 438/305 |
| 2008/0150033 A1 * | 6/2008 | Greene et al. | 257/369 |
| 2009/0081836 A1 * | 3/2009 | Liu et al. | 438/229 |
| 2009/0184423 A1 | 7/2009 | Erturk et al. | |

* cited by examiner

*Primary Examiner* — Long Tran
(74) *Attorney, Agent, or Firm* — Scully, Scott, Murphy & Presser, P.C.; Joseph P. Abate, Esq.

(57) ABSTRACT

In one embodiment, a method of providing a semiconductor device is provided, in which instead of forming isolation regions before the formation of the semiconductor devices, the isolation regions are formed after the semiconductor devices. In one embodiment, the method includes forming a semiconductor device on a semiconductor substrate. A placeholder dielectric is formed on a portion of a first surface of the substrate adjacent to the semiconductor device. A trench is etched into the substrate from a second surface of the substrate that is opposite the first surface of the substrate, wherein the trench terminates on the placeholder dielectric. The trench is filled with a dielectric material.

17 Claims, 4 Drawing Sheets

STRUCTURE AND METHOD FOR MAKING METAL SEMICONDUCTOR FIELD EFFECT TRANSISTOR (MOSFET) WITH ISOLATION LAST PROCESS

BACKGROUND

The present disclosure relates to semiconductor devices and methods of forming semiconductor devices including isolation regions.

For more than three decades, the continued miniaturization of silicon metal oxide semiconductor field effect transistors (MOSFETs) has driven the worldwide semiconductor industry. Various showstoppers to continue scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, methods for improving performance without scaling have become critical.

SUMMARY

In one embodiment, a method of providing a semiconductor device is provided, in which instead of forming isolation regions before the formation of the semiconductor devices, the isolation regions are formed after the semiconductor devices. In one embodiment, the method includes forming a semiconductor device on a semiconductor substrate. A placeholder dielectric for an isolation region is formed on a portion of a first surface of the semiconductor substrate adjacent to the semiconductor device. A trench is etched into the semiconductor substrate from a second surface of the semiconductor substrate that is opposite the first surface of the semiconductor substrate, wherein the trench terminates on the placeholder dielectric. The trench is filled with a dielectric material.

In another embodiment, a method of fabricating a complementary metal oxide semiconductor (CMOS) device is provided that includes providing a semiconductor substrate having a first region and a second region, forming a first gate structure in the first region of the semiconductor substrate, and forming a second gate structure in the second region of the semiconductor substrate. At least one dielectric layer is formed on a first surface of the semiconductor substrate and over the first gate structure and the second gate structure. The at least one dielectric layer is etched to provide a first remaining portion on sidewalls of the first gate structure and the second gate structure, and a second remaining portion on the first surface of the semiconductor substrate at an interface of the first region and the second region. The second remaining portion of the at least one dielectric layer forms a placeholder dielectric in the structures. A first conductivity dopant is ion implanted in the first region to provide a first conductivity type semiconductor device. A second conductivity dopant is ion implanted in the second region to provide a second conductivity type semiconductor device. A trench is etched into the semiconductor substrate from a second surface of the semiconductor substrate that is opposite the first surface of the substrate, wherein the trench terminates on the placeholder dielectric. The trench is filled with a dielectric material to provide an isolation region.

In another aspect, a semiconductor structure is provided that includes a semiconductor substrate having a first region and a second region. A first conductivity semiconductor device is present in the first region of the semiconductor substrate. A second conductivity semiconductor device is present in the second region of the semiconductor substrate. A trench isolation region is present on an interface between the first region and the second region, wherein the trench isolation region extends through an entire depth of the semiconductor substrate. A placeholder dielectric layer is present on the trench isolation region between the first conductivity semiconductor device and the second conductivity semiconductor device.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
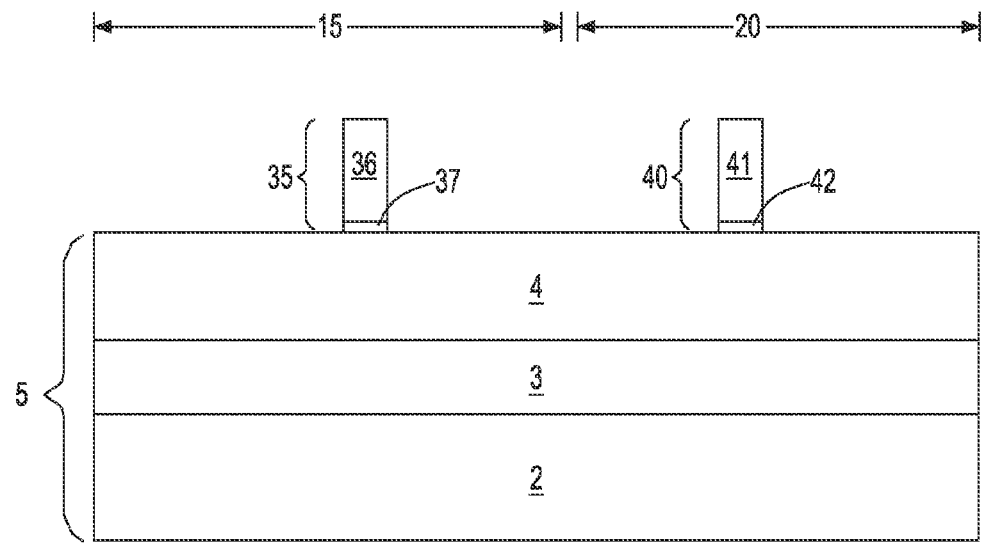
FIG. 1 is a side cross-sectional view of a semiconductor substrate having a first gate structure present in a first region of the semiconductor substrate, and a second gate structure that is present in a second region of the semiconductor substrate, in accordance with one embodiment of the present disclosure.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

It has been determined that isolation regions that are formed in the semiconductor substrate before forming semiconductor devices on the same semiconductor substrate can cause non-planarity and inconsistencies in lithographic processing. In some embodiments, instead of forming an isolation region, e.g., shallow trench isolation region, before forming semiconductor devices, e.g., metal oxide semiconductor field effect transistors (MOSFETS), the isolation regions are formed after the semiconductor devices have been formed. In some embodiments, by forming the isolation regions after the formation of semiconductor devices, the method described in this disclosure reduces across-chip linewidth variation, and reduces the incidence of high-k dielectric regrowth. When describing the inventive method and structures, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

As used herein, the term "conductivity type" denotes a dopant region being p-type or n-type.

As used herein, "p-type" refers to the addition of impurities to an intrinsic semiconductor that creates deficiencies of valence electrons. In a silicon containing substrate, examples of n-type dopants, i.e., impurities include but are not limited to boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

A "gate structure" means a structure used to control output current (i.e., flow of carriers in the channel) of a semiconducting device through electrical or magnetic fields.

As used herein, the term "drain" means a doped region in semiconductor device located at the end of the channel, in which carriers are flowing out of the transistor through the drain.

As used herein, the term "source" is a doped region in the semiconductor device, in which majority carriers are flowing into the channel.

As used herein the term "channel" denotes the region underlying the gate structure and between the source regions and the drain regions that become conductive when the device is turned on.

As used herein, the terms "insulating" and "dielectric" denote a material having a room temperature conductivity of less than $10^{-10}(\Omega\text{-m})^{-1}$.

A "high-k" dielectric is a dielectric or insulating material having a dielectric constant that is greater than the dielectric constant of silicon oxide.

The term "direct contact" means that a first element, such as a first structure, and a second element, such as a second structure, are connected without any intermediary conducting, insulating or semiconductor layers at the interface of the two elements.

As used herein, the term "selective" in reference to a material removal process denotes that the rate of material removal for a first material is greater than the rate of removal for at least another material of the structure to which the material removal process is being applied.

The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element.

FIGS. 1-6 depict one embodiment of a method for providing a semiconductor device, in which instead of forming isolation regions before the formation of the semiconductor devices, the isolation regions are formed after the semiconductor devices. In one embodiment, the method includes forming a semiconductor device on a semiconductor substrate. A placeholder dielectric 12 for an isolation region is formed on a portion of a first surface of the semiconductor substrate 5 adjacent to the semiconductor device. A trench 18 is etched into the semiconductor substrate 5 from a second surface of the semiconductor substrate that is opposite the first surface of the semiconductor substrate 5. The trench 18 terminates on the placeholder dielectric 12. The trench 18 is filled with a dielectric material.

FIG. 1 depicts one embodiment of a semiconductor substrate 5 having a first gate structure 35 present in a first region 15 and a second gate structure 40 present in a second region 20. The semiconductor substrate 5 may be composed of a Si-containing material. The term "Si-containing" is used herein to denote a material that includes silicon. Illustrative examples of Si-containing materials include, but are not limited to, Si, SiGe, SiGeC, SiC, polysilicon, i.e., polySi, epitaxial silicon, i.e., epi-Si, amorphous Si, i.e., α:Si, and multilayers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

The semiconductor substrate 5 may be a semiconductor on insulator (SOI) substrate. In one embodiment, an SOI substrate includes a bottom semiconductor layer 2 and a top semiconductor layer 4 (which is interchangeably referred to as an SOI layer) that are electrically isolated from each other by a buried insulating layer 3.

The SOI layer 4 and the bottom semiconductor layer 2 may comprise at least one of Si, Ge, SiGe, GaAs, InAs, InP, SiCGe, SiC as well as other III/V or II/VI compound semiconductors and alloys thereof. The SOI layer 4 and bottom semiconductor layer 2 may comprise the same or different materials. In one example, the SOI layer 4 may be amorphous, polycrystalline, or monocrystalline. In one example, the bottom semiconductor layer 2 may be amorphous, polycrystalline, or monocrystalline. The buried insulating layer 3 separating the SOI layer 4 and the bottom semiconductor layer 2 may be a crystalline or non-crystalline oxide, nitride, oxynitride, or any other suitable insulating material. The buried insulating layer 3 may comprise a single layer of dielectric material or multiple layers of dielectric materials. The buried insulating layer 3 may have a thickness ranging from 1 nm to 100 nm. Although the semiconductor substrate 5 is depicted as an SOI substrate, bulk semiconductor substrates have also been contemplated and are within the scope of the present disclosure.

A plurality of well regions may be located within the semiconductor substrate 5. In one embodiment, the well regions correspond to the first and second regions. In one example, in which the first region 15 is processed to provide at least one n-type field effect transistor (nFET), a first well region is present in the first region 15 being doped to a p-type conductivity. In one example, in which the second region 20 is processed to provide at least one p-type field effect transistor (pFET), a second well region is present in the second region 20 being doped to an n-type conductivity.

In one embodiment, the first gate structure 35 includes at least one first gate conductor 36 that is present on at least one first gate dielectric 37. In one embodiment, the second gate structure 40 includes at least one second gate conductor 41 that is present on at least one second gate dielectric 42. The first and second gate dielectrics 37, 42 may individually comprise separate dielectric materials such as oxides, nitrides and oxynitrides of silicon. The first and second gate dielectric 37, 42 may be a high-k material having a dielectric constant greater than silicon dioxide ($SiO_2$), e.g., greater than 4.0. In one embodiment, the material that provides the first and second gate dielectric 37, 42 has a dielectric constant ranging from 3.9 to 10, as measured in a vacuum at room temperature. Alternatively, one or both of the first and second gate dielectric 37, 42 may be composed of a higher dielectric constant dielectric material having a dielectric constant ranging from 10 to 100. Such higher dielectric constant dielectric materials may include, but are not limited to, hafnium oxides, hafnium silicates, titanium oxides, barium-strontium-titantates (BSTs) and lead-zirconate-titanates (PZTs). The first and second gate dielectrics 37, 42 may be formed using any of several deposition and growth methods, including but not limited to, thermal or plasma oxidation or nitridation methods, chemical vapor deposition methods and physical vapor deposition methods. The first and second gate dielectrics 37, 42 may be composed of the same material or different materials. Although the first and second gate dielectrics 37, 42 are depicted in the supplied figures as each being a single layer, embodiments have been contemplated in which the first and second gate dielectrics 37, 42 are each a multi-layered structure of conductive materials. In one embodiment, the first and second gate dielectrics 37, 42 have a thickness ranging from 10 angstroms to 200 angstroms.

The first and second gate conductors 36, 41 may be composed of conductive materials including, but not limited to, metals, metal alloys, metal nitrides and metal silicides, as well as laminates thereof and composites thereof. In one embodiment, the first and second gate conductors 36, 41 may be any conductive metal including, but not limited to, W, Ni, Ti, Mo, Ta, Cu, Pt, Ag, Au, Ru, Ir, Rh, and Re, and alloys that include at least one of the aforementioned conductive elemental metals. The first and second gate conductors 36, 41 may also comprise doped polysilicon and/or polysilicon-germanium alloy materials (i.e., having a dopant concentration from about 1e18 to about 1e22 dopant atoms per cubic centimeter) and polycide materials (doped polysilicon/metal silicide stack materials). The first and second gate conductors 36, 41 may be composed of the same material or different materials. The first and second gate conductors 36, 41 may be formed using a deposition method including, but not limited to, salicide methods, atomic layer deposition methods, chemical vapor deposition methods and physical vapor deposition methods, such as, but not limited to evaporative methods and sputtering methods. Although the first and second gate conductors 36, 41 are depicted in the illustrated drawings as each being a single layer, embodiments have been contemplated in which the first and second gate conductors 36, 41 are each a multi-layered structure of dielectric materials.

Still referring to FIG. 1, source/drain extension regions (not shown) are then formed using an ion implantation process step. More specifically, when forming p-type extension regions a typical dopant species is boron or $BF_2$. Boron may be implanted utilizing implant energies on the order of about 0.2 keV to about 3.0 keV with an implant dose of about $5 \times 10^{14}$ atoms/cm$^2$ to about $5 \times 10^{15}$ atoms/cm$^2$. $BF_2$ may be implanted utilizing implant energies on the order of about 1.0 keV to about 15.0 keV and a dose of about $5 \times 10^{14}$ atoms/cm$^2$ to about $5 \times 10^{15}$ atoms/cm$^2$. A typical implant for the n-type extension regions is arsenic. The n-type extension regions can be implanted with arsenic using implant energies on the order of about 1.0 keV to 10.0 keV with a dose of about $5 \times 10^{14}$ atoms/cm$^2$ to about $5 \times 10^{15}$ atoms/cm$^2$. In one embodiment, in which the semiconductor device that is being formed in the first region 15 is an n-type field effect transistor (nFET) and the semiconductor device that is being formed in the second region 20 is a p-type field effect transistor (pFET), the dopant for the source/drain extension regions in the first region 15 is an n-type dopant, and the dopant for the source/drain extension region in the second region 20 is a p-type field effect transistor (pFET). In one embodiment, the device further includes halo regions, which are composed of dopants having an opposite conductivity than the dopant that provides the source/drain extension regions, in which the halo regions are introduced using an angled ion implantation.

Figure 2:
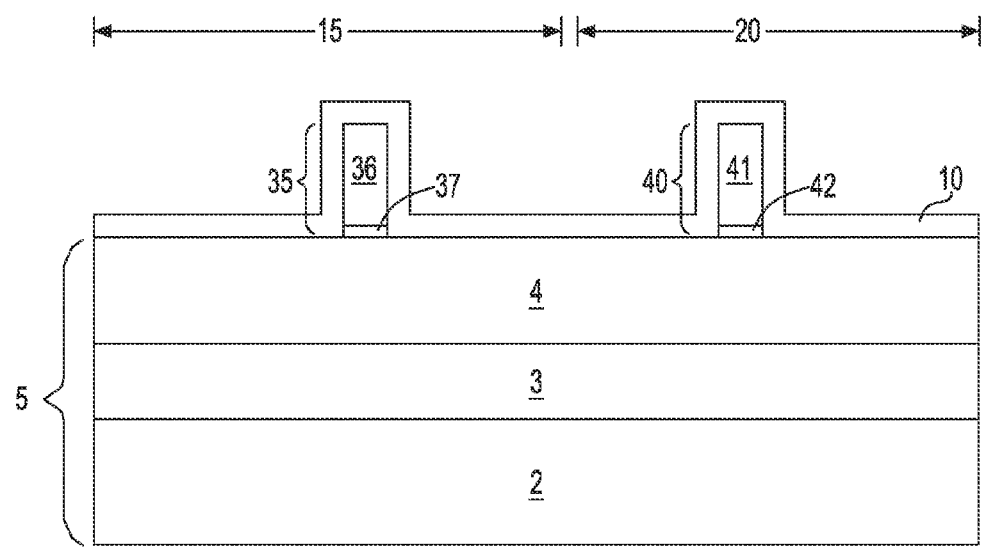
FIG. 2 is a side cross-sectional view depicting forming a dielectric layer on a first surface of the semiconductor substrate and over the first gate structure and the second gate structure, in accordance with one embodiment of the present disclosure.

FIG. 2 depicts one embodiment of forming at least one dielectric layer 10 on a first surface of the semiconductor substrate 5 and over the first gate structure 35 and the second gate structure 40. The at least one dielectric layer 10 is present on the sidewalls and upper surface of each of the first gate structure 35 and the second gate structure 40, and is present on the first surface of the semiconductor substrate 5 that is between the first and second gate structure 35, 40 and/or adjacent to the first and second gate structure 35, 40. The at least one dielectric layer 10 may be a blanket conformally deposited layer. As used herein, "a conformal layer" is a deposited material having a thickness that remains the same regardless of the geometry of underlying features on which the layer is deposited.

In some embodiments, the at least one dielectric layer 10 may be an oxide, nitride, or oxynitride material. In one example, the at least one dielectric layer 10 is composed of silicon nitride. In another example, the at least one dielectric layer 10 is composed of silicon oxide. In yet another example, the at least one dielectric layer 10 is composed of silicon oxynitride. It is noted that the above compositions for the at least one dielectric layer 10 is provided for illustrative purposes only, and are not intended to limit the present disclosure. Other materials can be employed for the at least one dielectric material 10, so long as they provide an etch stop to the etch chemistry that provides the subsequently formed trench for the isolation region. The at least one dielectric layer 10 may have a thickness ranging from 300 angstroms to 1500 angstroms. In one embodiment, the at least one dielectric layer 10 has a thickness ranging from 300 angstroms to 1000 angstroms.

The at least one dielectric layer 10 may be deposited using chemical vapor deposition (CVD). In one embodiment, chemical vapor deposition (CVD) is a deposition process in which a deposited species is formed as a results of chemical reaction between gaseous reactants at an elevated temperature (typically being greater than 600° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) and Plasma Enhanced CVD (PECVD), Metal-Organic CVD (MOCVD) and others.

Figure 3:
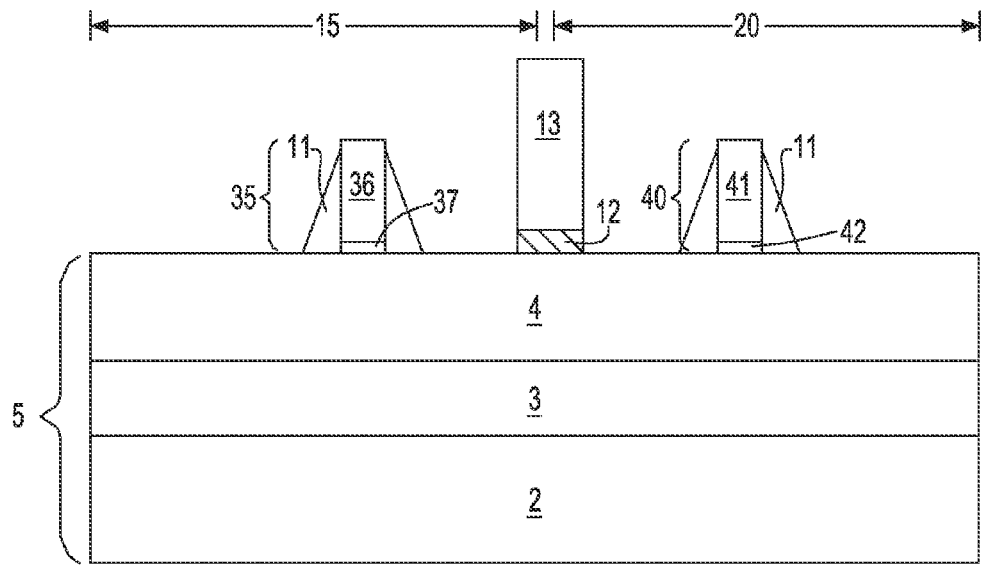
FIG. 3 is a side cross-sectional view depicting etching the dielectric layer to provide a first remaining portion on sidewalls of the first gate structure and the second gate structure, and a second remaining portion that provides a placeholder dielectric on the first surface of the semiconductor substrate at an interface of the first region and the second region, in accordance with one embodiment of the present disclosure.

FIG. 3 depicts one embodiment of etching the at least one dielectric layer 10 to provide a first remaining portion 11 (hereafter referred to as spacers 11) on the sidewalls of the first gate structure 35 and the second gate structure 40, and a second remaining portion (hereafter referred to as placeholder dielectric 12) on the first surface of the semiconductor substrate 5 at an interface of the first region 15 and the second region 20. A placeholder dielectric 12 is a material layer that is positioned to determine the location of a subsequently formed isolation region.

The spacers 11 may be formed from the at least one dielectric layer using photolithography and anisotropic etch processes. An anisotropic etch process is a material removal process in which the etch rate in the direction normal to the surface to be etched is much higher than in the direction parallel to the surface to be etched. In one embodiment, the anisotropic etch includes reactive ion etching (RIE). Reactive ion etching (RIE) is a form of plasma etching that during etching the surface to be etched is placed on the RF powered electrode, wherein the surface to be etched takes on a potential that accelerates the etching species extracted from a plasma toward the surface, to be etched in which the chemical etching reaction is taking place in the direction normal to the surface.

In one embodiment, the placeholder dielectric 12 is formed from the at least one dielectric layer 10 using deposition and photolithography to form a block mask 13, and then etching the exposed portion of the at least one dielectric layer selective to the block mask 13. The block mask 13 is formed protecting the portion of the at least one dielectric layer 10 that provides the placeholder dielectric 12. The exposed portion of the at least one dielectric layer 10 that is not protected by the block mask 13, and does not provide the spacers 11, is subsequently removed using a selective etch.

The block mask 13 may comprise soft and/or hardmask materials and can be formed using deposition, photolithography and etching. In one embodiment, the block mask 13 comprises a photoresist. A photoresist block mask 13 can be produced by applying a photoresist layer to the surface of the at least one dielectric layer 10, exposing the photoresist layer to a pattern of radiation, and then developing the pattern into the photoresist layer utilizing resist developer.

In another embodiment, the block mask 13 can be a hardmask material. Hardmask materials include dielectric compositions that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to: silsequioxanes, siloxanes, and boron phosphate silicate glass (BPSG). It is noted that the above materials are provided for illustrative purposes only, and are not intended to limit the present disclosure. Other materials are suitable for the hardmask material so long as they may be removed using an etch that is selective to the placeholder dielectric 12. A block mask 13 comprising a hardmask material may be formed by blanket depositing a layer of hardmask material, providing a patterned photoresist atop the layer of hardmask material, and then etching the layer of hardmask material to provide a block mask 13, in which the etching comprises an etch chemistry having a selectivity to at least the patterned photoresist.

The block mask 13 is positioned at the interface of the first region 15 and the second region 20. In embodiments in which the first region 15 includes a well of an opposite conductivity as the well in the second region 20 of the semiconductor substrate 5, the block mask 13 is present at the interface of the well regions. The positioning of the block mask 13 dictates the positioning of the placeholder dielectric 12, which corresponds to the positioning of the subsequently formed trench for the isolation region.

The exposed portion of the at least one dielectric layer 10 that is not protected by the block mask 13 and does not provide the spacers 11 is subsequently removed using a selective etch. The etch may be an anisotropic etch, such as reactive ion etch, or an isotropic etch, such as a wet etch. Following etching, the placeholder dielectric 12 may have a width ranging from 20 nm to 100 nm. In one embodiment, the placeholder dielectric 12 has a width ranging from 25 nm to 50 nm. The block mask 13 may be removed using a selective etch, chemical strip or oxygen ashing, as depicted in FIG. 4A.

Figure 4A:
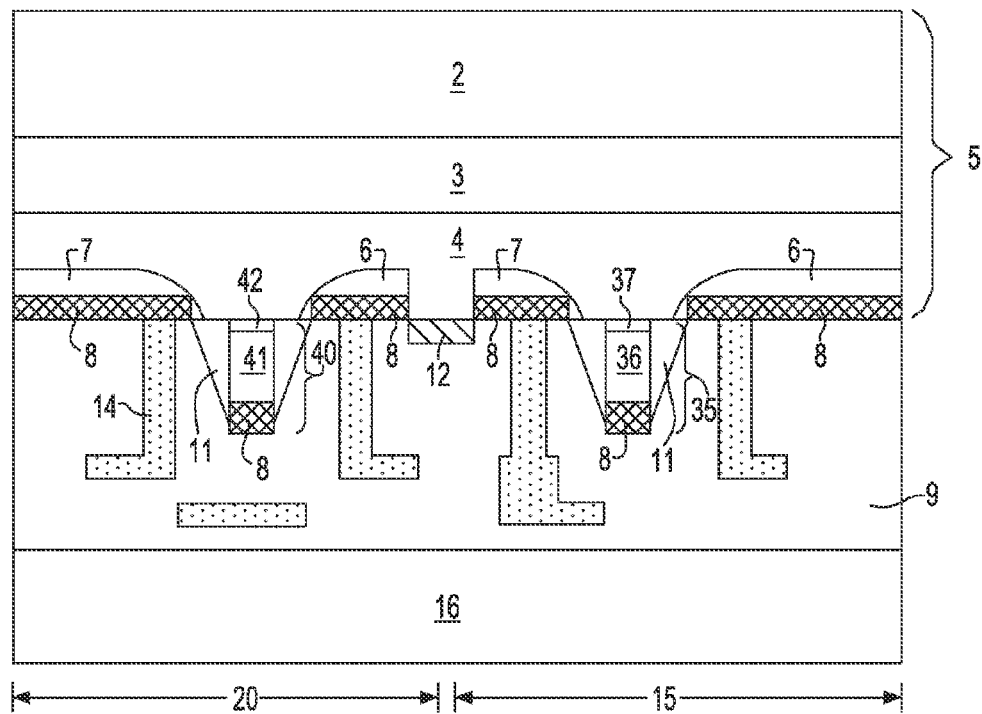
FIG. 4A is a side cross-sectional view depicting ion implanting a first conductivity dopant in the first region to provide a first conductivity type semiconductor device and a second conductivity dopant in the second region to provide a second conductivity type semiconductor device, forming metal semiconductor alloy regions, and bonding a carrier substrate to the second surface of the semiconductor substrate, in accordance with one embodiment of the present disclosure.

FIG. 4A depicts one embodiment of ion implanting a first conductivity dopant in the first region 15 to provide a first conductivity type semiconductor device and a second conductivity dopant in the second region 20 to provide a second conductivity type semiconductor device, forming metal semiconductor alloy regions 8, and bonding a carrier substrate 16 to the second surface of the semiconductor substrate 5.

In the embodiments, in which the extension source/drain regions have already been introduced to the semiconductor substrate 5, and the spacers 11 are employed to dictate the positioning of the implant for the deep source and drain regions 6, 7, deep source regions 6 and deep drain regions 7 may be formed using an ion implantation processing step. In one embodiment, in which the semiconductor device that is being formed in the first region 15 is an n-type field effect transistor (nFET) and the semiconductor device that is being formed in the second region 20 is a p-type field effect transistor (pFET), the dopant for the deep source regions 6 and the deep drain regions 7 in the first region 15 is an n-type dopant, and the dopant for the deep source regions 6 and the deep drain regions 7 in the second region 20 is a p-type dopant.

Typical implant species for the n-type deep source region 6 and the n-type deep drain region 7 may phosphorus or arsenic. The n-type deep source region 6 and the n-type deep drain region 7 may be implanted with phosphorus using an energy of about 3.0 keV to about 15.0 keV with a dose of about $1 \times 10^{15}$ atoms/cm$^2$ to about $7 \times 10^{15}$ atoms/cm$^2$. The n-type deep source region 6 and the n-type deep drain region 7 may be implanted with arsenic using an energy of about 6.0 keV to 30.0 keV with a dose of about $1 \times 10^{15}$ atoms/cm$^2$ to about $7 \times 10^{15}$ atoms/cm$^2$. Typical implant species for the p-type deep source region 6 and p-type deep drain region maybe boron or BF$_2$. The p-type deep source region 6 and the p-type deep drain region 7 can be implanted with boron utilizing an energy of about 1.0 keV to 8.0 keV with a dose of about $1 \times 10^{15}$ atoms/cm$^2$ to about $7 \times 10^{15}$ atoms/cm$^2$. The p-type deep source region 6 and the p-type deep drain region 7 may also be implanted with BF$_2$ with an implant energy of about 5.0 keV to about 40.0 keV and a dose of about $1 \times 10^{15}$ atoms/cm$^2$ to about $7 \times 10^{15}$ atoms/cm$^2$.

Metal semiconductor alloy regions 8 may be formed on an upper surface of each of the source regions and drain regions of the semiconductor substrate 5 and each of the first gate structure 35 and the second gate structure 40. The metal semiconductor alloy regions 8 may be composed of a silicide or a germicide. Silicide formation typically requires depositing a refractory metal such as cobalt, nickel, or titanium onto the surface of a Si-containing material. Following deposition, the structure is subjected to an annealing step using conventional processes such as, but not limited to, rapid thermal annealing. During thermal annealing, the deposited metal reacts with Si forming a metal silicide. The remaining unreacted metal is removed by an etch process.

Figure 4B:
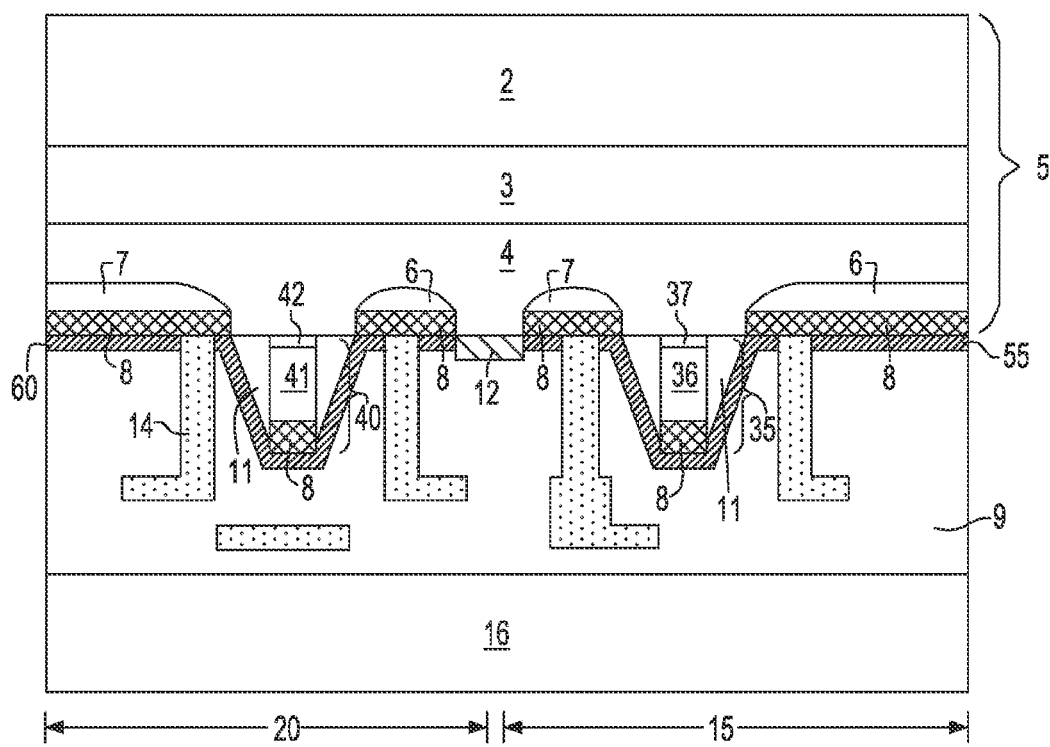
FIG. 4B is a side cross-sectional view depicting ion implanting a first conductivity dopant in the first region to provide a first conductivity type semiconductor device and a second conductivity dopant in the second region to provide a second conductivity type semiconductor device, forming stress inducing liners, forming metal semiconductor alloy regions, and bonding a carrier substrate to the second surface of the semiconductor substrate, in accordance with one embodiment of the present disclosure.

Referring to FIG. 4B, in some embodiments stress inducing liners are formed overlying the first gate structure 35 of a semiconductor device and the second gate structure 40 of a semiconductor device. The term "stress inducing liner" denotes a material having an intrinsic stress, in which the intrinsic stress effectuates a stress in an underlying material. In one embodiment, in which the first region 15 includes an n-type conductivity semiconductor device, such as an nFET, the stress inducing liner is a tensile stress inducing liner 55. The term "tensile stress inducing material" denotes a material layer having an intrinsic tensile stress, in which the intrinsic tensile stress produces a tensile stress in an underlying material. In one embodiment, in which the second region 20 includes an p-type semiconductor device, such as a pFET, the stress inducing liner is a compressive stress inducing liner 60. The term "compressive stress inducing material" denotes a material having an intrinsic compressive stress, in which the intrinsic compressive stress produces a compressive stress in an underlying material. The tensile stress inducing liner 55 and the compressive stress inducing liner 60 may be formed using deposition, photolithography and etching.

Plasma enhanced chemical vapor deposition (PECVD) can form stress inducing dielectrics having a compressive or tensile internal stress. The stress state of the stressed dielectric layer deposited by PECVD can be controlled by changing the deposition conditions to alter the reaction rate within the deposition chamber. More specifically, the stress state of the deposited stressed dielectric layer may be set by changing the deposition conditions such as: $SiH_4/N_2$/He gas flow rate, pressure, RF power, and electrode gap.

Rapid thermal chemical vapor deposition (RTCVD) can provide stress inducing dielectrics having an internal tensile stress. The magnitude of the internal tensile stress produced within the stressed dielectric layer deposited by RTCVD can be controlled by changing the deposition conditions. More specifically, the magnitude of the tensile stress within the deposited stressed dielectric layer may be set by changing deposition conditions such as: precursor composition, precursor flow rate and temperature.

In one embodiment, tensile stress inducing liner 55 formation includes PECVD of silicon nitride, in which the deposition conditions include a low frequency power ranging from 0 W to 100 W, a high frequency power ranging from 200 W to 600 W, a silane flow rate ranging from 50 sccm to 200 sccm, an $NH_3$ flow rate ranging from 1,500 sccm to 3,000 sccm, and a deposition pressure of 15 Torr or less. The tensile stress inducing liner 55 can be deposited to a thickness generally in the range from 300 angstroms to 1500 angstroms. In one embodiment, the tensile stress liner has a thickness ranging from 300 angstroms to 1000 angstroms.

In one embodiment, the compressive stress inducing liner 60 comprises PECVD of silicon nitride, in which the deposition conditions include a low frequency power ranging from 500 W to 1,500 W, a high frequency power ranging from 250 W to 500 W, a silane flow rate ranging from 800 sccm to 2,000 sccm, an $NH_3$ flow rate ranging from 6,000 to 10,000 sccm, and a deposition pressure of 10 Torr or less. The compressive stress inducing liner 60 can be deposited to a thickness generally in the range of from 300 angstroms to 1500 angstroms.

In one embodiment, compressive stress inducing liner 60 has a thickness ranging from 300 angstroms to 1000 angstroms.

Referring to FIGS. 4A and 4B, an interlevel dielectric material 9 can be blanket deposited atop the entire semiconductor substrate 5 and planarized. The interlevel dielectric material 9 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric material 9 include: any of the aforementioned materials in porous form, or in a form that changes during processing to or from being porous and/or permeable to being non-porous and/or non-permeable. The deposited dielectric is then patterned and etched to form via holes to the various source/drain and gate structure regions of the device. Following via formation interconnects 14 are formed by depositing a conductive metal into the via holes using deposition methods, such as CVD or plating. The conductive metal may include, but is not limited to: tungsten, copper, aluminum, silver, gold and alloys thereof.

FIGS. 4A and 4B further depict one embodiment of bonding a carrier substrate 16 to the second surface of the semiconductor substrate 5. The carrier substrate 16 may be composed of a semiconductor containing material, such as a Si-containing material. Illustrative examples of Si-containing materials for the carrier substrate 16 include, but are not limited to: Si, SiGe, SiGeC, SiC, polysilicon, i.e., polySi, epitaxial silicon, i.e., epi-Si, amorphous Si, i.e., α:Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide. The carrier substrate 16 may also be a dielectric material, such as an oxide, nitride, or oxynitride material.

The carrier substrate 16 can be thermally bonded to the semiconductor substrate 5 through insulating layers positioned there between, such as the interlevel dielectric material 9. Prior to bonding the interlevel dielectric material 9 may be planarized. "Planarization" is a material removal process that employs at least mechanical forces, such as frictional media, to produce a planar surface. For example, the interlevel dielectric material 9 may be planarized using chemical mechanical planarization. "Chemical Mechanical Planarization" is a material removal process using both chemical reactions and mechanical forces to remove material and planarize a surface. The first planarizationed surface of the interlevel dielectric material 9 is then contacted with the carrier substrate 16 under thermal conditions sufficient to create bonding between the planarized surface of the interlevel dielectric material 9 and the carrier substrate 16. In some embodiments, an optional adhesive layer 17 may be present between the interlevel dielectric material 9 and the carrier substrate 16.

Figure 5:
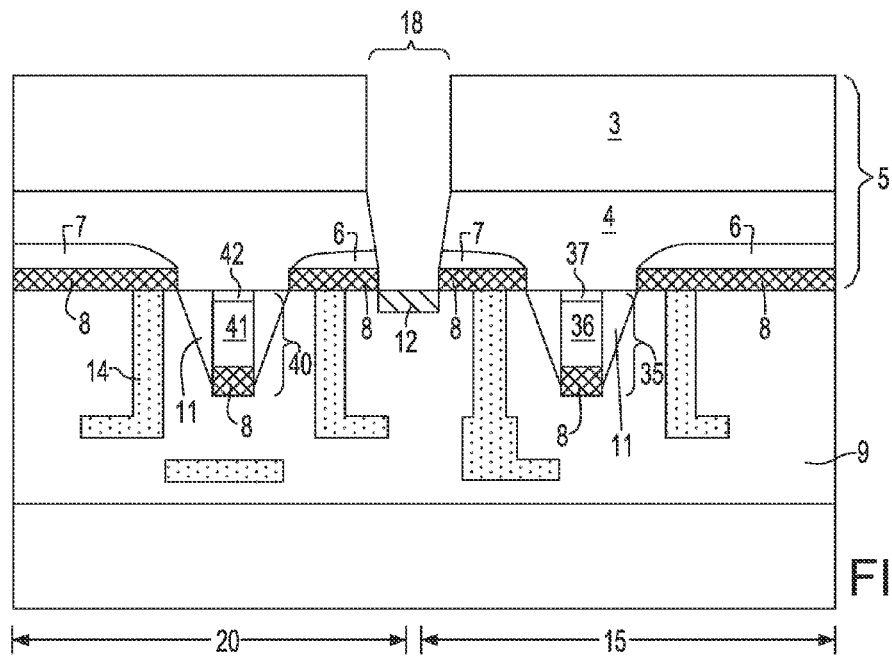
FIG. 5 is a side cross-sectional view depicting one embodiment of etching a trench into the semiconductor substrate from a second surface of the semiconductor substrate that is opposite the first surface of the substrate, wherein the trench terminates on the placeholder dielectric, in accordance with one embodiment of the present disclosure.

FIG. 5 depicts one embodiment of etching a trench 18 into the semiconductor substrate 5 from a second surface of the semiconductor substrate 5 that is opposite the first surface of the semiconductor substrate 5. The trench 18 terminates on the placeholder dielectric 12. In one embodiment, the bottom semiconductor layer 2 of the semiconductor substrate 5 is removed prior to the trench forming process using a planarization process. For example, the planarization process may be continued until contacting the buried insulating layer 3. In one embodiment, the planarization process may be chemical mechanical planarization. In another embodiment, the bottom semiconductor layer 2 may be removed by an etch process that is selective to the buried insulating layer 3. In some embodiments, the bottom semiconductor layer 2 is not removed prior to forming the trench 18.

The trench 18 is formed by etching the semiconductor substrate 5 utilizing a conventional dry etching process such as reactive-ion etching (RIE) or plasma etching, in combination with a photoresist mask. More specifically, a layer of photoresist is deposited atop the entire second surface of the semiconductor substrate 5, wherein the second surface may be the exposed surface of the buried insulating layer 3. The photoresist layer is then selectively exposed to light and developed to pattern a photoresist mask, protecting the portion of the semiconductor substrate 5 that is not being etched to provide the trench 18, and exposing at least one second region of the semiconductor substrate 5 in which the trench 18 is to be formed. The exposed portion of the second surface of the semiconductor substrate 5 is aligned to the placeholder dielectric 12 that is present on the opposing side, i.e., first surface, of the semiconductor substrate 5. The exposed portion of the second surface of the semiconductor substrate 5 is then etched. In one example, the etch process is an anisotropic etch process, such as reactive ion etch. In one embodiment, the etch process may be a multi-stage etch. In the first etch stage, the exposed portion of the buried insulating layer 3 of the semiconductor substrate 5 may be etched selectively to the SOI layer 4 of the semiconductor substrate 5 and the photoresist mask. In the second etch stage, the SOI layer 4 of the semiconductor substrate 5 may be etched selective to the placeholder dielectric 12 and the photoresist mask. Following the etch process that provides the trench 18, the photoresist mask may be removed by a chemical strip, selective etch or oxygen ashing.

Figure 6:
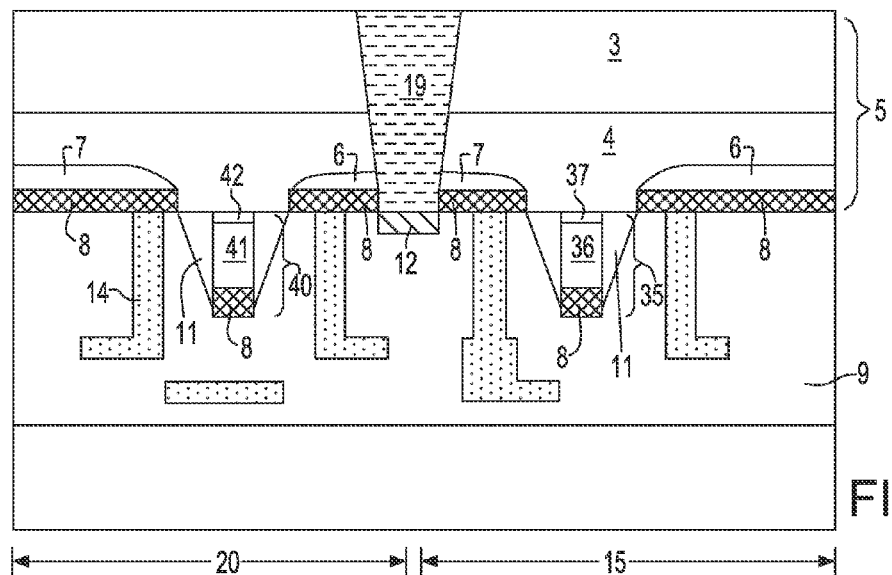
FIG. 6 is a side cross-sectional view depicting filling the trench with a dielectric material to provide the isolation region, in accordance with one embodiment of the present disclosure.

FIG. 6 depicts filling the trench 18 with a dielectric material to provide the isolation region 19. The dielectric material may be an oxide, nitride, or oxynitride. The dielectric material may also be polysilicon. In one example, the dielectric material is silicon oxide. In another example, the dielectric material is silicon nitride. In an even further embodiment, the dielectric material is silicon oxynitride. The dielectric material that fills the trench 18 may be deposited using chemical vapor deposition (CVD). Variations of CVD processes that are suitable for filling the trench with dielectric material include, but are not limited to, Atmospheric Pressure CVD (APCVD), Low Pressure CVD (LPCVD) and Plasma Enhanced CVD (EPCVD), Metal-Organic CVD (MOCVD) and others. The dielectric material that fills the trench 18 may optionally be densified after deposition.

Still referring to FIG. 6, in one embodiment, the present method provides an isolation region 19, i.e., trench isolation region, that is present on an interface between the first region 10 and the second region 15 of the semiconductor substrate 5. The isolation region 19 extends through an entire depth of the semiconductor substrate 5. The placeholder dielectric layer 12 is present, in direct contact with the isolation region 19 and the first surface of the semiconductor substrate 5.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an isolation region comprising:
   forming a gate structure of a semiconductor device on a semiconductor substrate before forming the isolation region;
   forming a placeholder dielectric on a portion of a first surface of the semiconductor substrate adjacent to the semiconductor device after forming the gate structure;
   etching a trench into the semiconductor substrate from a second surface of the semiconductor substrate that is opposite the first surface of the substrate, wherein the trench terminates on the placeholder dielectric; and
   filling the trench with a dielectric material to provide the isolation region.

2. The method of claim 1, wherein the semiconductor device comprises source and drain regions adjacent to the gate structure, in which the gate structure further comprises at least one gate dielectric underlying at least one gate conductor.

3. The method of claim 2, wherein forming the gate structure comprises forming a gate stack including at least one gate dielectric layer on the semiconductor substrate, and at least one gate conductor layer on the at least one gate dielectric layer; forming a first etch mask overlying a portion of the gate stack; and etching the gate stack selective to the first etch mask and the semiconductor substrate to provide the gate structure.

4. The method of claim 3, wherein forming the source region and the drain region comprises ion implanting a p-type dopant into the semiconductor substrate when the semiconductor device is a p-type semiconductor device, or ion implanting a n-type dopant into the semiconductor substrate when the semiconductor device is a n-type semiconductor device.

5. The method of claim 4, wherein the forming of the placeholder dielectric on the portion of the first surface of the semiconductor substrate adjacent to the semiconductor device comprises depositing at least one dielectric layer over the gate structure prior to forming the source regions and the drain regions; and etching the at least one dielectric layer to provide a first remaining portion on sidewalls of the gate structure and a second remaining portion to provide the placeholder dielectric on the portion of the first surface of the semiconductor substrate, in which the portion of the first surface that the second remaining portion of the at least one dielectric layer on is present is laterally offset from the gate structure.

6. The method of claim 5, wherein the first remaining portion of the at least one dielectric, on the sidewalls of the spacer functions as a spacer during the ion implanting that provides the source region and the drain region.

7. The method of claim 1, wherein the etching of the trench comprises bonding a carrier substrate to the second surface of the semiconductor substrate, forming a second etch mask exposing the portion of the semiconductor substrate corresponding to the subsequently formed said trench; etching the trench through the semiconductor substrate selective to the second etch mask and the placeholder dielectric.

8. The method of claim 7, wherein the etching the trench is provided by reactive ion etch.

9. The method of claim 1, wherein the filling of the trench comprises chemical vapor deposition of an oxide, nitride or oxynitride containing material.

10. A method of fabricating a CMOS device comprising:
providing a semiconductor substrate having a first region and a second region;
forming a first gate structure in the first region of the semiconductor substrate and a second gate structure in the second region of the semiconductor substrate;
forming at least one dielectric layer on a first surface of the semiconductor substrate and over the first gate structure and the second gate structure;
etching the at least one dielectric layer to provide a first remaining portion on sidewalls of the first gate structure and the second gate structure, and a second remaining portion that provides a placeholder dielectric on the first surface of the semiconductor substrate at an interface of the first region and the second region;
ion implanting a first conductivity dopant in the first region to provide a first conductivity type semiconductor device and a second conductivity dopant in the second region to provide a second conductivity type semiconductor device;
etching a trench into the semiconductor substrate from a second surface of the semiconductor substrate that is opposite the first surface of the substrate, wherein the trench terminates on the placeholder dielectric; and
filling the trench with a dielectric material to provide the isolation region.

11. The method of claim 10 wherein the first conductivity type semiconductor device is an n-type field effect transistor (nFET) and the second conductivity type semiconductor device is a p-type field effect transistor (pFET).

12. The method of claim 10 wherein a first stress inducing material is present on the first conductivity type semiconductor device, and a second stress inducing material is present on the second conductivity type semiconductor device.

13. The method of claim 12, wherein the first stress inducing material is a tensile stress inducing material and the second stress inducing material is a compressive stress inducing material.

14. The method of claim 10, wherein the forming of the first gate structure and the second gate structure comprises forming a gate stack including at least one gate dielectric layer on the semiconductor substrate, and at least one gate conductor layer on the at least one gate dielectric layer; and etching the gate stack to provide the first gate structure and the second gate structure.

15. The method of claim 10, wherein the etching of the trench comprises bonding a carrier substrate to the second surface of the semiconductor substrate, forming a second etch mask exposing the portion of the semiconductor substrate corresponding to the subsequently formed said trench; etching the trench through the semiconductor substrate selective to the second etch mask and the placeholder dielectric.

16. The method of claim 15, wherein the etching of the trench is provided by reactive ion etch.

17. The method of claim 10, wherein the filling of the trench comprises chemical vapor deposition of an oxide, nitride or oxynitride containing material.

* * * * *